(12) United States Patent
Kim

(10) Patent No.: US 8,794,816 B2
(45) Date of Patent: Aug. 5, 2014

(54) LED LIGHTING APPARATUS

(71) Applicant: LG Innotek Co., Ltd., Seoul (KR)

(72) Inventor: Jong Woon Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/718,861

(22) Filed: Dec. 18, 2012

(65) Prior Publication Data

US 2013/0155664 A1    Jun. 20, 2013

(30) Foreign Application Priority Data

Dec. 19, 2011    (KR) .................. 10-2011-0137815

(51) Int. Cl.
*H01L 51/50* (2006.01)
*H01L 33/00* (2010.01)

(52) U.S. Cl.
CPC ............... *H01L 33/00* (2013.01); *H01L 51/50* (2013.01)
USPC .......................... 362/650; 315/136

(58) Field of Classification Search
CPC .................. H01L 51/50; H01L 33/00
See application file for complete search history.

(56) References Cited

U.S. PATENT DOCUMENTS

| | | | | |
|---|---|---|---|---|
| 7,521,872 | B2 * | 4/2009 | Bruning | 315/158 |
| 2007/0007898 | A1 * | 1/2007 | Bruning | 315/34 |
| 2009/0115336 | A1 * | 5/2009 | Wang | 315/136 |
| 2013/0136454 | A1 * | 5/2013 | Yu | 398/106 |

* cited by examiner

*Primary Examiner* — Mary Ellen Bowman
(74) *Attorney, Agent, or Firm* — Birch, Stewart, Kolasch & Birch, LLP

(57) ABSTRACT

An LED lighting apparatus according to the embodiment includes: a heat radiation frame having a reception groove therein; a substrate disposed on a top surface of the heat radiation frame and to which at least one light emitting device is attached; an antenna on a top surface of an upper end portion of the heat radiation frame; and a diffusion frame combined with the light emitting frame and formed therein with a reception groove for receiving the substrate and the antenna.

11 Claims, 5 Drawing Sheets

LED LIGHTING APPARATUS

The present application claims priority under 35 U.S.C. 119 and 35 U.S.C. 365 to Korean Patent Application No. 10-2011-0137815 (filed on Dec. 19, 2011, which is hereby incorporated by reference in its entirety.

BACKGROUND

A light emitting diode (LED) is a kind of a semiconductor device that converts electric energy into light.

The LED is advantageous as compared with a conventional light source, such as a fluorescent lamp or an incandescent lamp, in terms of life span, response characteristics, stability and environmental-friendly requirement.

In this regard, various studies have been performed to replace the conventional light sources with the LEDs. The LEDs are increasingly used as light sources for lighting devices, such as various lamps used indoors and outdoors, liquid crystal displays, electric signboards, and street lamps.

FIG. 1 is a view showing a structure of an LED lighting apparatus according to the related art.

Referring to FIG. 1, the LED lighting apparatus includes a heat radiation frame 10, a substrate 30 which is formed in the heat radiation frame 10 and to which at least one light emitting device 20 is attached, and a diffusion frame 40 which covers the substrate 30 to which the light emitting device is attached.

Further, a reception groove (not shown) is formed in the heat radiation frame 10, and a power supplying module (not shown) is provided in the reception groove.

The power supply module is electrically connected to the light emitting device 20 attached to the substrate 30 to supply a driving power for driving the light emitting device 20.

The light emitting device 20 generates light by the driving power supplied through the power supply module. The generated light is radiated to the outside through the diffusion frame 40.

However, the LED lighting apparatus described above is not equipped with a function of controlling an intensity of light generated from the light emitting device 20 through the communicate with the outside.

In order to have the function of automatically controlling the light intensity, an additional communication module for communicating with the outside must be disposed in the reception groove of the heat radiation frame 10.

However, since the heat radiation frame 10 has a wave shielding function, the performance of the communication module placed in the heat radiation frame 10 is degraded due to the wave shielding function of the heat radiation frame 10.

SUMMARY

The embodiment provides an LED lighting apparatus having a wireless control function.

The embodiment provides an antenna structure which improves a signal receiving performance and an LED lighting apparatus including such an antenna.

Technical objects of the embodiment may not be limited to the above-mentioned objects and other technical objects of the embodiment will be apparent to those skilled in the art from the following description.

An LED lighting apparatus according to the embodiment includes: a heat radiation frame having a reception groove therein; a substrate disposed on a top surface of the heat radiation frame and to which at least one light emitting device is attached; an antenna on a top surface of an upper end portion of the heat radiation frame; and a diffusion frame combined with the light emitting frame and formed therein with a reception groove for receiving the substrate and the antenna.

The upper end portion of the heat radiation frame has a flat top surface, and the substrate and the antenna are disposed on the top surface of the upper end portion.

The antenna is exposed out of the heat radiation frame.

A power supply module is disposed in the reception groove of the heat radiation frame, wherein the light emitting device attached to the substrate is electrically connected to the power supply module.

A communication module is disposed in the reception groove of the heat radiation frame, and the antenna is connected to the communication module.

The substrate is provided in a central region of the top surface of the heat radiation frame while partially exposing the top surface of the heat radiation frame, and the antenna is formed in an outer peripheral region of the top surface exposed by the substrate.

The top surface of the upper end portion of the heat radiation frame has a through hole through which the antenna is inserted into the reception groove.

One end of the antenna is connected to the top surface of the heat radiation frame and an opposite end of the antenna is inserted into the through hole and connected to the communication module disposed in the reception groove.

A plurality of protrusions formed on the top surface of the heat radiation frame, wherein the antenna is formed on the protrusions.

According to the embodiment described above, in order to remove the wave shielding by the RF receiving module installed in the heat radiation metal case, the antenna for receiving a signal is exposed out of the heat radiation metal case, so that the signal reception performance of the antenna embedded in the LED lighting apparatus having the wireless control function can be improved.

Meanwhile, other various effects of the embodiment will be directly or indirectly disclosed in the following detailed description of the embodiment.

DETAILED DESCRIPTION OF THE EMBODIMENTS

The proposed embodiment will be described below.

Hereinafter, the embodiments will be described in detail with reference to accompanying drawings. The scope of the embodiments is not limited to the proposed embodiment. Any other embodiments that are deteriorated by addition, change, and deletion of component parts or included within the scope of the spirit of the disclosure will be easily proposed.

In addition, although terms used in the embodiments are selected from general terms that are currently used, an applicant may arbitrarily suggest terms in specific cases. Since the terms suggested by the applicant will be described in detail in relation to operations and meanings in a corresponding description part of the embodiments, the embodiments should be understood in relation to the operations and meanings represented in the terms instead of names of the terms.

That is, in the following description, the term "include(s)" may not exclude other components or steps.

Figure 1:
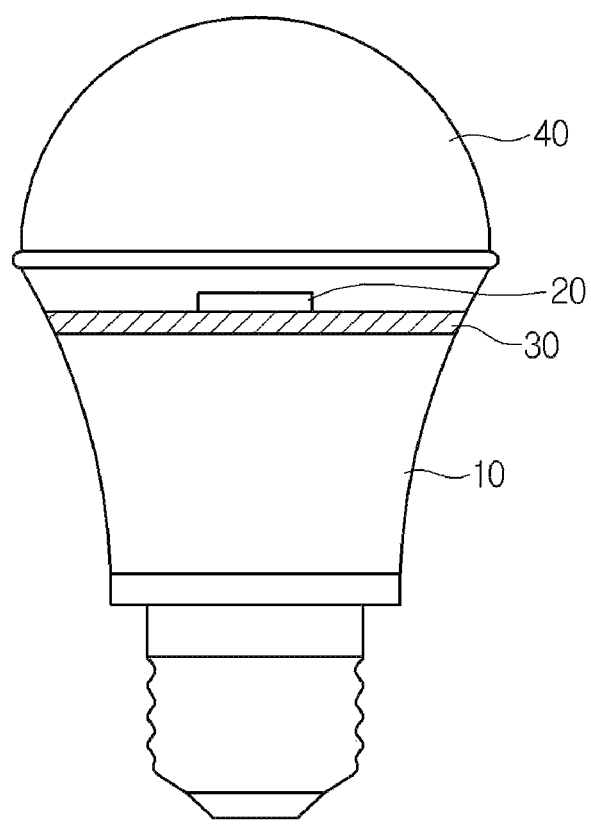
FIG. 1 is a view showing a structure of an LED lighting apparatus according to the related art.
Figure 2:
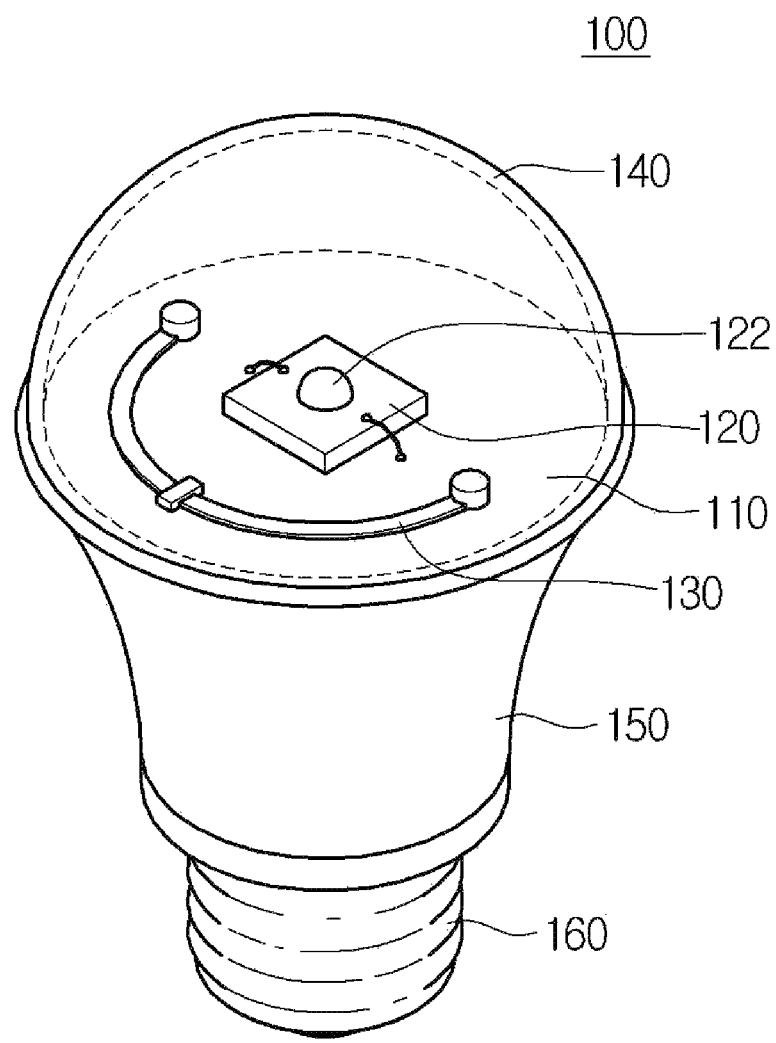
FIG. 2 is a view showing a structure of an LED lighting apparatus according to the embodiment.

FIG. 2 is a view showing a structure of an LED lighting apparatus according to the embodiment.

Referring to FIG. 2, the LED lighting apparatus 100 includes a heat radiation frame 110, a substrate 120, an antenna 130, a diffusion frame 140, an inner case 150 and a socket 160.

The heat radiation frame 110 has a reception groove for receiving at least one module 170 and 180.

Further, the heat radiation frame 110 includes an upper end portion having a flat top surface and a lower end portion extending in a substantially vertical direction along a periphery of the flat top surface of the upper end portion.

The heat radiation frame 110 may be formed of a metal or a resin material which is superior in heat radiation efficiency, but the embodiment is not limited thereto. A material of the heat radiation frame 110 may include at least one of Al, Ni, Cu, Ag, Sn and Mg.

As shown in the drawings, a top surface of the heat radiation frame 110 may be disposed on a heat radiation plate. The heat radiation plate may be formed of a silicon pad or a thermal conductive tape, such that the heat generated from the substrate 120 formed on the top surface may be effectively transferred to the heat radiation frame 110.

The substrate 120 includes at least one light emitting device 122. The substrate 120 has a rectangular shape, but the embodiment is not limited thereto.

The substrate 120 may be an insulator on which a circuit pattern is patterned. For example, the substrate 120 may include a printed circuit board (PCB), a metal core PCB, a flexible PCB, or a ceramic PCB. Further, the substrate may include a COB (Chips On Board) type PCB in which an unpackaged LED chip may be directly bonded on a board.

Further, the substrate 120 may be formed of a material of effectively reflecting light, and may have a color such as a white color or a silver color.

At least one light emitting device 122 may be disposed on the substrate 120, and may be a light emitting diode chip of emitting red, green or blue light, or UV (Ultraviolet) rays.

The light emitting diode may have a lateral type or a vertical type and may radiate light having one of blue, red, yellow and green.

Although not shown in the drawings, a lens may be additionally formed on the light emitting device 122. The lens may be disposed on the substrate 120 to cover the light emitting device 122. The lens controls an orientation angle or a direction of the light emitted from the light emitting device 122. The lens has a hemisphere shape and is filled with light-transmitting resin such as silicon resin or epoxy resin without any empty space. The light-transmitting resin may include entirely or partially distributed phosphor.

When the light emitting device 122 is a blue light emitting diode, the phosphor included in the light-transmitting resin of the lens may include at least one of garnet (YAG, TAG), silicate, nitride, and oxynitride-based materials.

Although the light-transmitting resin includes only yellow-based phosphor to implement natural light (white light), the resin may further include green-based phosphor or red-based phosphor for improving color rendering index (CRI) and for reducing color temperature.

When various kinds of phosphors are mixed into the light-transmitting resin, an additive rate according to a phosphor color may uses much green-based phosphor rather than red-based phosphor and much yellow based-phosphor rather than green-based phosphor.

The garnet (YAG), silicate and oxynitride-based materials may be used as the yellow-based phosphor, the silicate and oxynitride-based materials may be used as the green-based phosphor, and nitride-based material may be used as the red-based phosphor.

As well as various kinds of phosphors may be mixed into the light-transmitting resin, the layers having red based phosphor, green based phosphor and having yellow based phosphor may be separately stacked.

The substrate 120 is formed on a top surface of the heat radiation frame 110. The substrate 120 is formed while an outer area of the heat radiation frame 100 is exposed.

The antenna 130 is formed in the outer region of the top surface exposed by the substrate 120. The antenna 130 receives a signal transmitted from an outside and transmits a signal generated from an internal to the outside.

In this case, when the antenna 130 is formed in the heat radiation frame 110, since the antenna 130 does not normally receive and transmit the signals due to the wave shielding of the heat radiation frame 110, the antenna 130 is exposed out of the heat radiation frame 110, as described above.

The diffusion frame 140, in which a reception groove for receiving the substrate 120 onto which the light emitting device 122 is attached and the antenna 130, is formed is disposed over the heat radiation frame 110.

The diffusion frame 140 has a bulb shape and an inner surface on which paint is coated. The paint may include a diffusion material to diffuse the light passing through the heat radiation frame 110 at the inner surface of the diffusion frame 140.

Although glass may be used as a material of the diffusion frame 140, since the glass material has problems in a weight or an impact from an outside, plastic, polypropylene (PP), or polyethylene (PE) is preferably used as the material of the diffusion frame 140. More preferably, polycarbonate (PC), which has good lightfast, heat resistant and impact characteristics, may be used as a material of the heat radiation frame 110.

The diffusion frame 140 has an inner surface of which surface roughness is greater than that of the outer surface thereof. That is, when light generated from the light emitting device 122 is radiated into the inner surface of the diffusion frame 140 to be emitted to an outside, the surface roughness is provided for the purpose of sufficiently scattering and diffusing the light radiated into the inner surface of the diffusion frame 140. Therefore, when the inner and outer roughness of the diffusion frame 140 is formed, the light emitting characteristic may be improved.

Preferably, the diffusion frame 140 is formed through a blow molding scheme which widens an orientation angle of light among molding schemes.

The inner case 150 may be formed of a material having superior insulation and durability, such as a resin material.

The inner case 150 is formed between a power supply module 170 inserted inside the heat radiation frame 110 and the heat radiation frame 110, so that an electrical short which may be caused between the heat radiation frame 110 and the power supply module 170 is prevented, so a withstand voltage of the LED lighting apparatus 100 may be improved.

The socket 160 is electrically connected to an external power source, so that external power is provided to the power supply module 170.

Hereinafter, the LED lighting apparatus 100 will be described in more detail with reference to the accompanying drawings.

Figure 3:
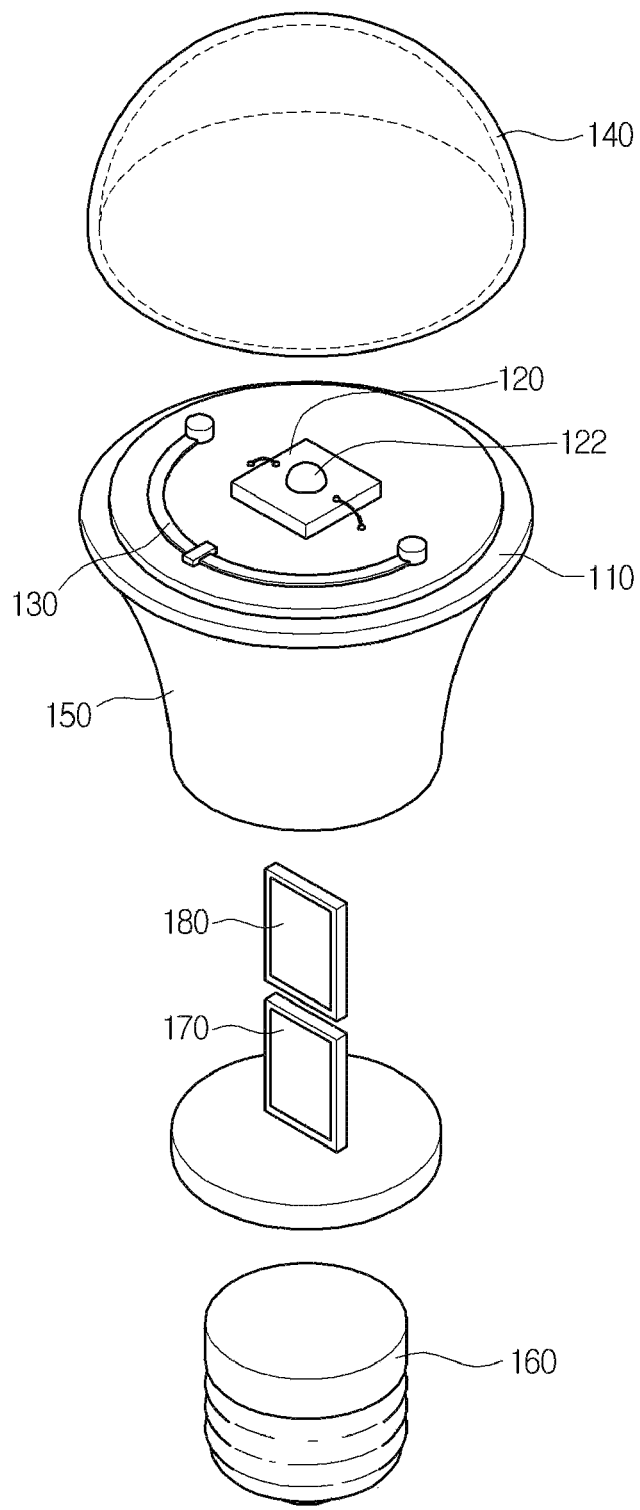
FIG. 3 is a disassembled perspective view showing the LED lighting apparatus depicted in FIG. 2.
Figure 4:
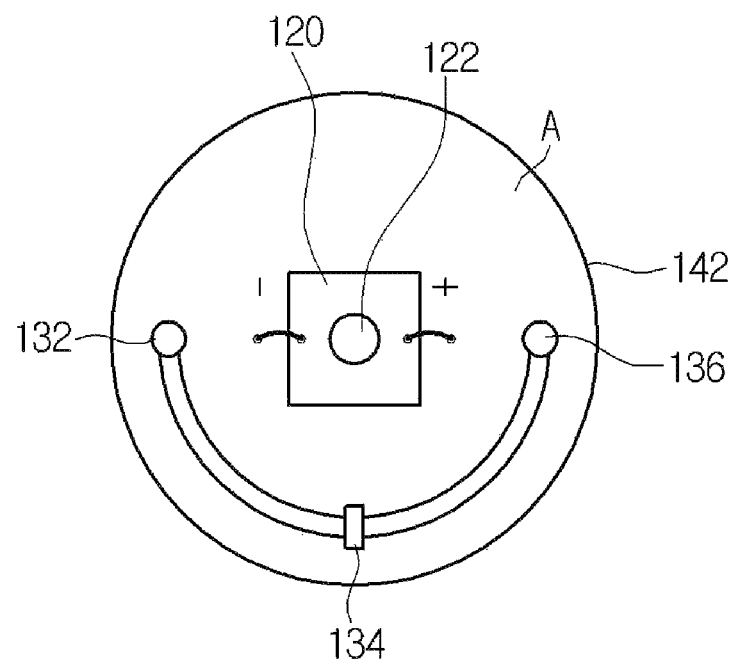
FIG. 4 is a plane view showing the heat radiation frame depicted in FIG. 2.
Figure 5:
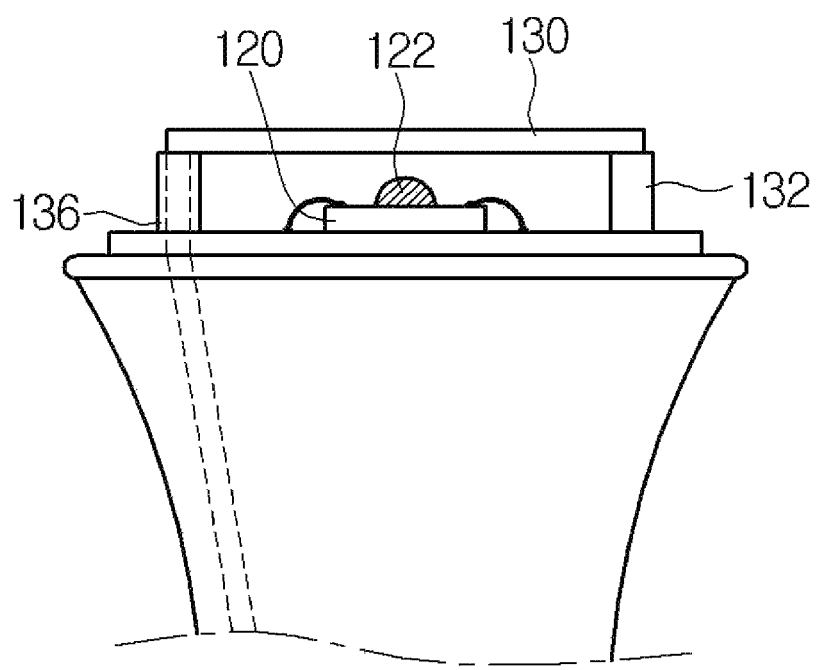
FIG. 5 is a front view showing the heat radiation frame depicted in FIG. 2.

FIG. 3 is an exploded perspective view showing the LED lighting apparatus depicted in FIG. 2, FIG. 4 is a plan view of the heat radiation frame depicted FIG. 2, and FIG. 5 is a front view of the heat radiation frame depicted in FIG. 2.

The power supply module 170 and the communication module 180 are disposed in the reception groove formed inside the heat radiation frame 110.

The power supply module 170 and the communication module 180 may be disposed in the reception groove while the power supply module 170 and the communication module 180 stand vertically. When the power supply module 170 and the communication module 180 are vertically disposed, as compared with a case that the power supply module 170 and the communication module 180 are disposed in horizontal direction, an air flow occurs inside the inner case 150 in upper and lower directions due to convection, so that the heat radiation efficiency of the LED lighting apparatus 100 may be improved.

The power supply module 1700 is connected to wires for positive (+) and negative (−) electrodes, and the wires are electrically connected to the substrate 120 disposed on the top surface.

Therefore, in order to expose the wires on the top surface of the heat radiation frame 110, wire holes are formed at the top surface of the heat radiation frame 110. The wire holes includes holes for the positive (+) and negative (−) wires.

The antenna 130 is disposed on the top surface of the heat radiation frame 110 and spaced apart at a predetermined interval from a disposition region of the substrate 120.

That is, the substrate 120 is disposed in a central region on the top surface and the antenna 130 is disposed in an outer region of the top surface and along a periphery of the top surface. Thus, the operation of the light emitting device 122 attached onto the substrate 120 prevents the reception performance of the antenna 130 from deteriorating.

One end of the antenna 130 is combined with the top surface of the heat radiation frame 110, and the other end of the antenna 130 is connected to the communication module 180 disposed inside the heat radiation frame 110.

To do this, a through hole 136 is formed on the top surface of the heat radiation frame 110 to insert the antenna 130 therein. The other end of the antenna 130 is inserted into the heat radiation frame 110 through the through hole 136 to be connected to the communication module 180.

Meanwhile, the antenna 130 is spaced apart at a predetermined distance from the top surface of the heat radiation frame 110.

To do this, a plurality of protrusions 132 and 134 are formed on the top surface A of the heat radiation frame 110.

A first protrusion 132 is formed on the top surface of the heat radiation frame 110 to be connected to the one end of the antenna 130. The one end of the antenna 130 is attached onto the first protrusion 132.

The through hole 136 is protruded at a predetermined height from the top surface of the heat radiation frame 110. Thus, the antenna 130 does not substantially make contact with the heat radiation frame 110 and is disposed to be exposed to out of the heat radiation frame 110.

Meanwhile, in order to dispose the antenna 130 in the outer region of the top surface A, a second protrusion 134 is additionally formed between the first protrusion 132 and the through hole 136 and a middle portion of the antenna exposed from the top surface of the heat radiation frame 110 is disposed on the second protrusion 134.

According to the embodiment, in order to remove the wave shielding by the RF receiving module installed in the metal case for radiating heat, the antenna is exposed out of the metal case for radiating heat, so that the signal receiving performance of the antenna embedded in the LED lighting apparatus having the wireless control function can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An LED lighting apparatus comprising:
   a heat radiation frame having a reception groove therein;
   a substrate disposed on a top surface of the heat radiation frame and to which at least one light emitting device is attached;
   an antenna disposed on a top surface of an upper end portion of the heat radiation frame; and
   a diffusion frame combined with the heat radiation frame and formed therein with a reception groove for receiving the substrate and the antenna.

2. The LED lighting apparatus of claim 1, wherein the upper end portion of the heat radiation frame has a flat top surface, and
   the substrate and the antenna are disposed on the top surface of the upper end portion.

3. The LED lighting apparatus of claim 1, wherein the antenna is exposed out of the heat radiation frame.

4. The LED lighting apparatus of claim 1, further comprising
   a power supply module is disposed in the reception groove of the heat radiation frame,
   wherein the light emitting device attached to the substrate is electrically connected to the power supply module.

5. The LED lighting apparatus of claim 1, wherein a communication module is disposed in the reception groove of the heat radiation frame, and the antenna is connected to the communication module.

6. The LED lighting apparatus of claim 5, wherein the substrate is provided in a central region of the top surface of the heat radiation frame while partially exposing the top surface of the heat radiation frame, and the antenna is formed in an outer peripheral region of the top surface exposed by the substrate.

7. The LED lighting apparatus of claim 1, wherein the top surface of the upper end portion of the heat radiation frame has a through hole through which the antenna is inserted into the reception groove.

8. The LED lighting apparatus of claim 7, wherein one end of the antenna is connected to the top surface of the heat radiation frame and an opposite end of the antenna is inserted into the through hole and connected to the communication module disposed in the reception groove.

9. The LED lighting apparatus of claim 7, further comprising a plurality of protrusions formed on the top surface of the heat radiation frame,
wherein the antenna is formed on the protrusions.

10. The LED lighting apparatus of claim 4, wherein the power supply module is vertically erected and inserted into the reception groove of the heat radiation frame.

11. The LED lighting apparatus of claim 5, wherein the communication module is vertically erected and inserted into the reception groove of the heat radiation frame.

* * * * *